(12) United States Patent
Fuchs et al.

(10) Patent No.: US 6,210,755 B1
(45) Date of Patent: Apr. 3, 2001

(54) METHOD AND EVAPORATION CHAMBER FOR GENERATING A CONTINUOUS VAPOR STREAM CONTAINING A COMPOUND HAVING MONOVALENT GALLIUM THEREIN, AND A VACUUM COATING APPARATUS

(75) Inventors: Manfred Fuchs, Nuernberg; Erich Hell; Detlef Mattern, both of Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/436,987

(22) Filed: Nov. 9, 1999

(30) Foreign Application Priority Data

Nov. 12, 1998 (DE) ............................................. 198 52 325

(51) Int. Cl.[7] ............................. C23C 14/00; C23C 16/00
(52) U.S. Cl. ................. 427/255.34; 427/65; 427/126.1; 427/250; 427/255.23; 427/255.28; 427/444
(58) Field of Search ...................................... 427/126.1, 65, 427/250, 255.34, 248.1, 444, 255.23, 255.28; 423/111, 135

(56) References Cited

U.S. PATENT DOCUMENTS

| 4,001,481 | * | 1/1977 | Tarutani et al. ...................... 428/469 |
| 4,286,545 | | 9/1981 | Takagi et al. . |
| 5,015,323 | * | 5/1991 | Gallagher .............................. 156/345 |
| 5,075,055 | * | 12/1991 | Finicle ................................... 264/81 |
| 5,736,069 | | 4/1998 | Willems et al. . |

\* cited by examiner

*Primary Examiner*—Shrive Beck
*Assistant Examiner*—Michael Barr
(74) *Attorney, Agent, or Firm*—Schiff Hardin & Waite

(57) ABSTRACT

In a method and evaporation chamber for generating a continuous vapor stream containing a compound in which gallium is present in monovalent form of a vacuum coating method for vacuum coating a substrate, an evaporation substance containing gallium in bivalent or trivalent form, is arranged together with metallic gallium in the evaporation chamber, that is closed on all sides and has a vapor exit opening. The evaporation substance is evaporated, and the vapor is brought into contact with the metallic gallium, causing the bivalent or trivalent gallium to be reduced to monovalent gallium in a vapor stream which subsequently exits in the direction of the substrate via the vapor exit opening.

20 Claims, 2 Drawing Sheets

METHOD AND EVAPORATION CHAMBER FOR GENERATING A CONTINUOUS VAPOR STREAM CONTAINING A COMPOUND HAVING MONOVALENT GALLIUM THEREIN, AND A VACUUM COATING APPARATUS

BACKGROUND OF THE INVENTION

1. Field of the Invention

The present invention relates to a method and evaporation chamber for generating a continuous vapor stream containing a compound in which gallium is present in monovalent form in a vacuum coating process for vacuum coating a substrate. The invention also relates to a vacuum coating apparatus operating according to such a method and having such an evacuation chamber.

2. Description of the Prior Art

Monovalent gallium ($Ga^{1+}$) is frequently used as a doping substance in X-ray absorber materials such as CsBr or RbBr for storage phosphors. Substrates coated therewith are needed as radiation detectors for radiographic applications, for example. The monovalent gallium is applied as GaBr, but GaBr cannot be chemically isolated. To achieve a doping despite this fact, it is suggested in U.S. Pat. No. 5,736,069 to use GaCl as the starting material, which is mixed with metallic Ga and with the X-ray absorber material CsBr. This mix is dried at 400° C., after which a monocrystal of the phosphor is grown at high temperature (e.g. 925° C.). The powder-type phosphor is obtained by milling the monocrystal, and is dispersed in a solvent (e.g. ethyl acetate) in a solution of a binder (e.g. polyethyl acrylate), and is layered onto the carrier film, for instance by pouring, rolling or sedimenting. High-quality layers cannot be produced in this way. Good X-ray absorber layers are usually produced in the context of a vacuum evaporating process; that is, the X-ray absorber material is first evaporated in an evaporating device and then settles on the carrier. The high vapor pressure of the required starting materials, namely the bivalent or trivalent gallium-halogenide compound and the gallium metal, acts to inhibit deposition of the doping substance containing monovalent gallium, which can be GaBr or GaI, by means of a vacuum coating method, since these would evaporate abruptly in the vacuum at common evaporating temperatures in the range of a few hundred degrees upon the formation of the dopant, even before the reaction of the starting materials has begun. As a result, it has not been possible to perform doping with monovalent gallium in the context of a vacuum coating, and particularly to simultaneously generate the X-ray absorber layer and to introduce the doping in the context of an evaporation process.

SUMMARY OF THE INVENTION

An object of the present invention is to provide a method that enables the generation of a continuous vapor stream containing a monovalent gallium doping substance even in a vacuum, despite the above described problems, so that a vacuum doping is possible.

This object is achieved in accordance with the invention in a method for generating a continuous vapor stream containing a compound in which gallium is present in monovalent form in the context of a vacuum coating method for vacuum coating a substrate, wherein a multivalent gallium-containing evaporation substance (i.e., an evaporation substance containing gallium in bivalent or trivalent form) is provided together with metallic gallium in an evaporating vessel or chamber that is closed on all sides and that has a vapor stream exit opening. The evaporation substance is evaporated in this evaporating chamber, and the vapor is brought into contact with the metallic gallium, causing the bivalent or trivalent gallium to be reduced to monovalent gallium, which subsequently exits in the direction of the substrate via the vapor stream exit opening.

In the inventive method, the reaction components—that is, the evaporation substance consisting of a gallium compound, particularly a gallium halogenide in which the gallium is present in bivalent or trivalent form, as well as the metallic gallium—are arranged in a closed evaporation chamber, where the evaporation of the evaporation substance and the actual reaction occur. At the chamber, only a very small vapor stream exit opening is provided, via which the vapor stream containing the doping substance (for instance the GaBr) can exit. Since the reaction substances are present in a closed chamber containing only a small opening, an abrupt evaporation is prevented, despite the temperature, since the pressure relation prevailing in the interior prevents a complete evaporation. The reaction of the vaporous evaporation substance and the metallic gallium which takes place in the closed reaction space can be sufficient to enable the generation of a continuous vapor stream containing the doping substance, which exits into the vacuum chamber and in the direction of the substrate via the exit window. The inventive method thus makes it possible to continuously generate the dopant vapor stream inside a vacuum coating apparatus in which there is a vacuum, in the context of a vacuum coating process.

The evaporation substance can be inventively arranged in the evaporation chamber on a first level, and the metallic gallium can be arranged on a second level situated over the first level, so that the evaporation substance is evaporated separately from the metallic gallium but comes into contact with it and reacts with it inside the chamber. Alternatively, the evaporation substance can be inventively mixed with the metallic gallium, so that the evaporation substance is evaporated in the metallic gallium, and an immediate reaction occurs. The reaction temperature for the reduction lies between 250° C. and 950° C., particularly between 300° C. and 900° C. The higher the temperature, the more complete the reaction; the reaction temperature at which the vaporous evaporation substance and the metallic gallium react should preferably be about 500° C. In the embodiment wherein the evaporation of the evaporation substance occurs separately from the metallic gallium, in order to prevent the substance from evaporating too rapidly, a temperature gradient from 300° C. to 500° C., particularly from 350° C. to 450° C., is inventively produced between the metallic gallium and the evaporation substance, for which purpose the evaporation substance can be inventively cooled and/or the metallic gallium can be heated. In this way it is also possible to cool the evaporation substance for lowering the vapor pressure, while allowing adjustment of the temperature in the range in which the reaction takes place.

In a further embodiment of the invention, the evaporation chamber is cooled in the region of the vapor exit opening, which likewise results in a local lowering of the pressure at that location. As a result, the expansion of particulate vapor which takes place as the vapor exits through the vapor exit opening is "weaker" in the transition into the vacuum; so that fewer particle collisions arise in this expansion; thereby allowing the vapor particles to travel more linearly in the direction of the substrate. A drifting apart and "smearing" of the vapor stream thus can be counteracted and a relatively sharper (more confined) vapor stream can be generated in the direction of the substrate. To both enable both a build-up of the required pressure relations and generation of a sufficiently sharp vapor stream jet, it is appropriate to use an evaporation chamber with a vapor stream exit opening having a diameter between 2 μm and 2 mm, particularly between 5 μm and 1.5 mm, preferably between 10 μm and 2 mm. Several such small vapor exit openings can be provided. The evaporation chamber should consist of a material that does not react with the evaporation substance and/or with the metallic gallium or which cannot be wetted by these materials, such as graphite, aluminum oxide or boric nitride. In a further embodiment of the invention, the evaporation substance can be evaporated before, during or after the evaporation of a coating material with which the substrate is being coated, particularly an X-ray absorber material. That is, the X-ray absorber material can be evaporated first followed by evaporation of the doping substance in a common evaporation apparatus. A reverse sequence of evaporation is also possible, and a simultaneous evaporation along with a coating of the substrate with the evaporation compound containing gallium in monovalent form and with the X-ray absorber material is particularly expedient.

The invention is also directed to an evaporation chamber for evaporating a substance, particularly one containing gallium, in the context of a vacuum coating process, this chamber being suitable for use in the method described above. This evaporation chamber inventively has at least one space for accepting at least one evaporation substance and at least one other substance that acts chemically on the evaporation substance, and it can be or is closed on all sides, and has a vapor stream exit opening with a diameter of less than 2 mm, particularly less than 1 mm, provided at at least one side.

Two spaces can be provided in the inventive chamber which are situated one above the other and which are separated by a vapor-permeable dividing wall, the lower space being provided for accepting the evaporation substance, and the upper space being provided for accepting the additional substance. The dividing wall can be inventively formed by a wire grating or a grid of holes or the like, or by a lid-like cover having one or more openings. The dividing wall consists of a material that does not react with the additional substance and/or with the substrate vapor and/or cannot be wetted by these. If the upper space is suitable for accepting the metallic gallium, in particular, then the dividing wall can inventively consist of graphite or aluminum oxide.

At least one heater can be additionally provided in accordance with the invention for heating a region of the chamber, preferably disposed in the region of the base of the chamber, such as the base of the lower space, or in the region of the dividing wall. At least one cooling arrangement for cooling a region of the chamber can be additionally provided, in the upper chamber region, particularly in the region of the vapor exit opening. The upper space itself can be closable with a lid-like cover containing the vapor exit opening. The chamber itself can be made of graphite, aluminum oxide, or boric nitride, as can the upper lid-like cover, as warranted.

The invention also relates to a device for vacuum coating a substrate with an evaporation material, having at least one evaporation chamber of the above described type.

DESCRIPTION OF THE PREFERRED EMBODIMENTS

Figure 1:
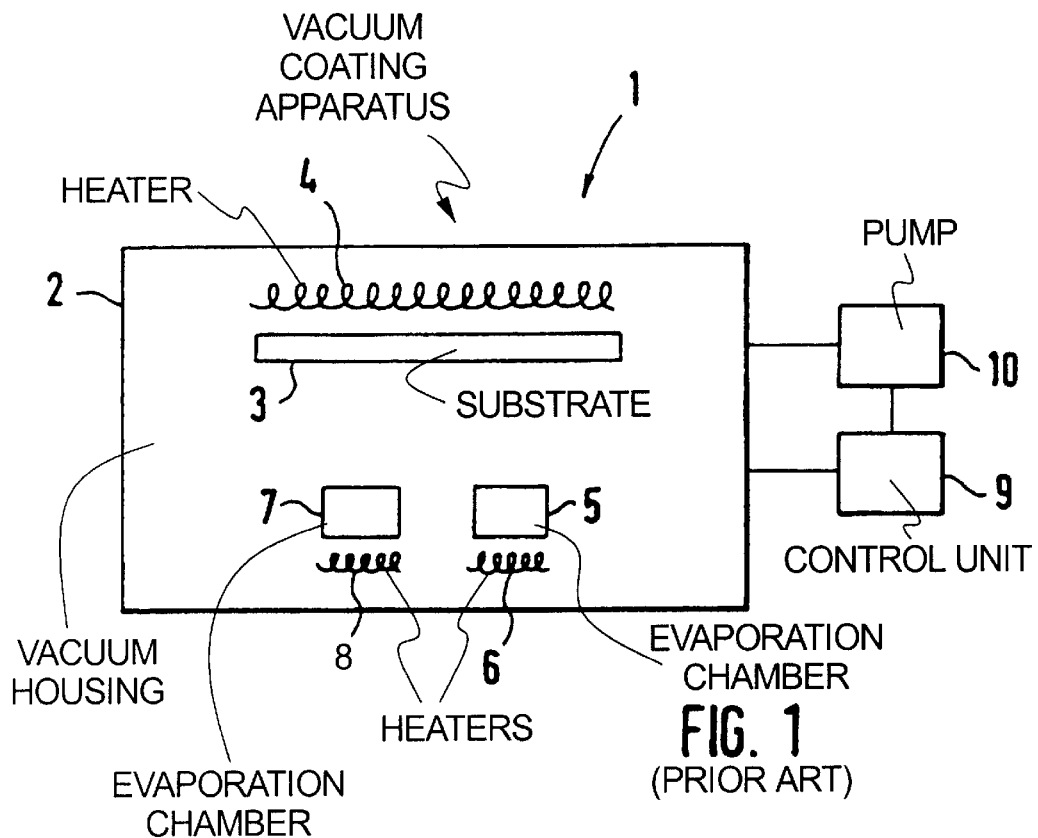
FIG. 1 is a schematic illustration of a device for vacuum coating, as known in the art.

FIG. 1 depicts a known apparatus 1 for vacuum coating, which is indicated only in an exemplary schematic form. The apparatus includes a vacuum housing 2, in which the substrate 3 that is to be coated can be arranged. A heater 4 is allocated to this substrate 3, with which the substrate 3 can be heated. A first evaporation chamber 5 with an allocated heater 6 is also provided, in which the X-ray absorber material that is to be deposited on the substrate 3 is contained and can be evaporated. An additional evaporation chamber 7 is also provided, to which a heater 8 is likewise allocated. In this evaporation chamber 7, the reaction components for generating the dopant vapor stream, which is subsequently deposited on the substrate 3 as well, are located. A control unit 9 and a pump 10 are also depicted, the control unit 9 serving to control all the heaters 4,6,8 as well as to control the pump 10 by means of which the vacuum is created in the vacuum housing 2. To the extent described below, components of this conventional arrangement can be used with the inventive embodiments described below.

Figure 2:
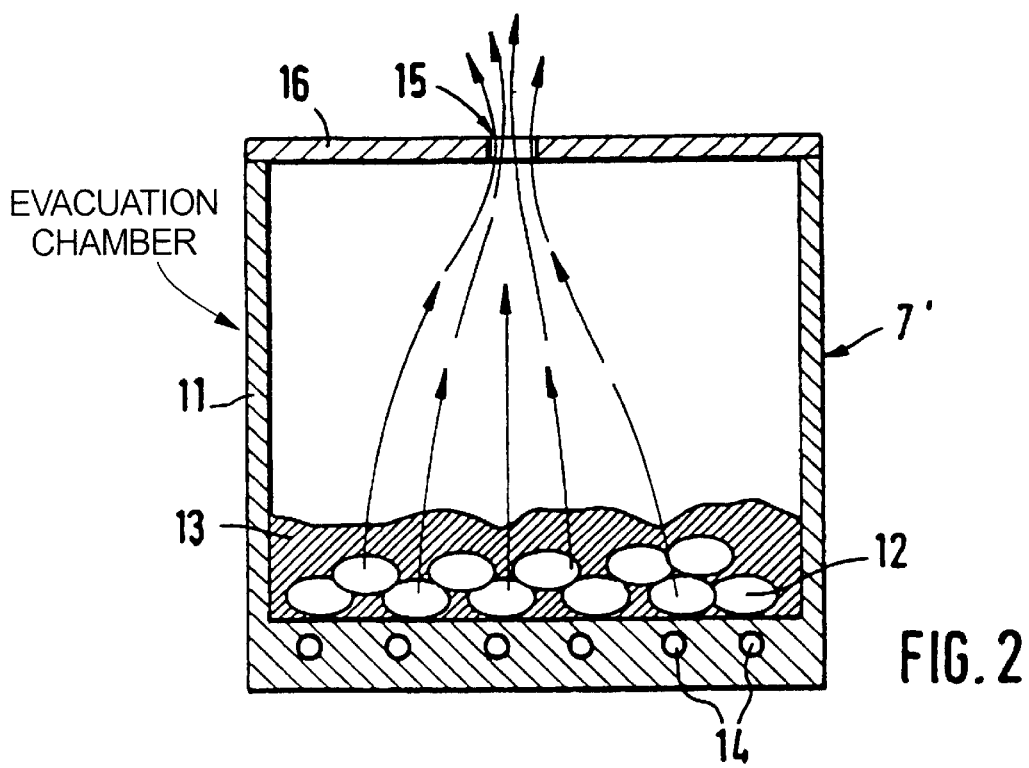
FIG. 2 is a side sectional view of a first embodiment of an evaporation chamber in accordance with the invention.

FIG. 2 depicts an inventive evaporation chamber 7' in a first embodiment. This evaporation chamber 7' has a housing 11, which is preferably made of boric nitride, aluminum oxide or graphite. In the example, an evaporation substance 12, for instance $GaBr_2$ or $GaBr_3$, and an additional substance 13, for instance metallic gallium, are arranged in the interior of the evaporation chamber 7'. In the example, a heater 14 is provided in the region of the base, for heating the materials 12, 13. This leads to the evaporation of the evaporation substance 12 and the vaporized substance comes into direct contact with the additional substance 13 and reacts therewith for generating a dopant compound.

For example, if $GaBr_2$ or $GaBr_3$ is used as the evaporation substance, and metallic gallium is used as the additional substance, then the vaporized evaporation substance is reduced from the metallic gallium, as follows:

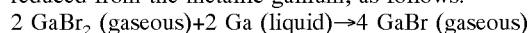

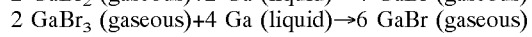

The GaBr contained in the dopant vapor which is generated in this way exits into the vacuum region of the device housing 2 in the direction of the substrate 3 via an evaporation exit opening 15, which is formed at a lid-like cover 16 that can be placed onto the housing 11. The diameter of the evaporation exit opening preferably is in the range between 10 μm and 1 mm. The lid-like cover 16 is also made of the above described material. It has two other functions besides closing the chamber housing 11. First, by means of the vapor exit opening is therein, the vapor current is channeled and its volume is limited, since the amount exiting from the interior of the evaporation chamber 7' depends on the diameter of the opening 15. Second, the cover 16 also serves to protect of the substrate against splashing of metallic gallium in the release of the GaBr gas.

Figure 3:
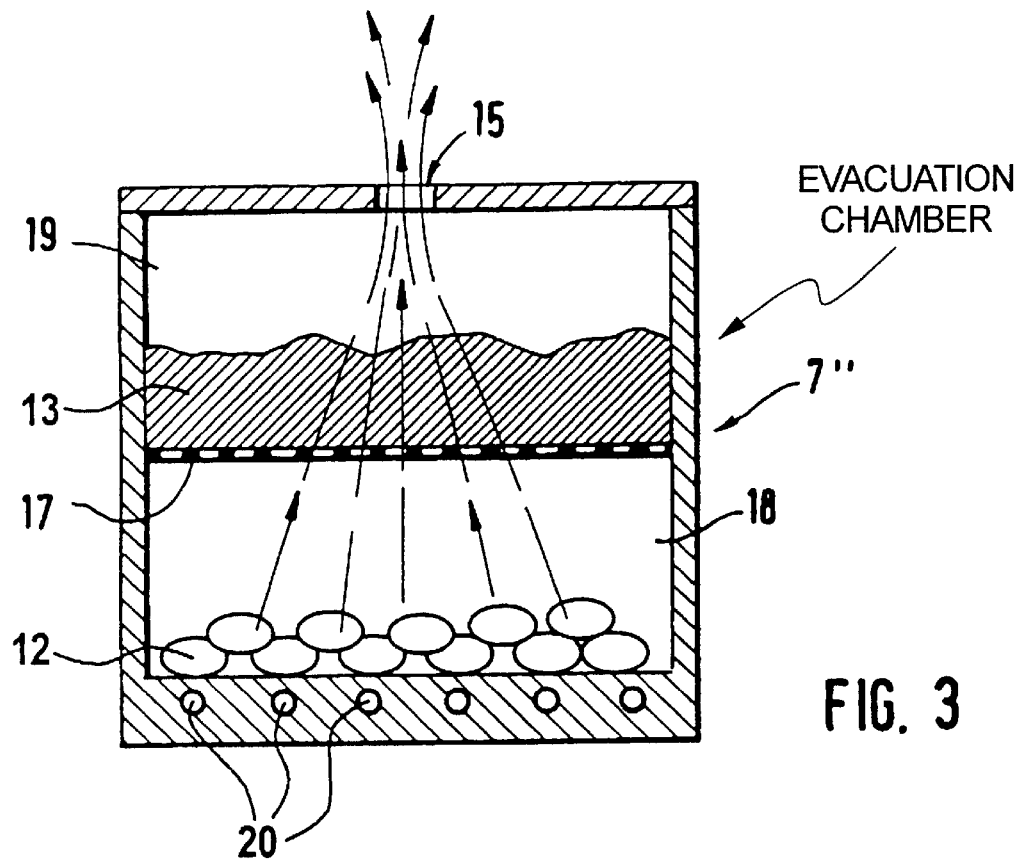
FIG. 3 is a side sectional view of a second embodiment of an evaporation chamber in accordance with the invention.

FIG. 3 depicts another embodiment of an evaporation chamber 7". This has a horizontal dividing wall 17, which divides the interior of the chamber 7' into two spaces 18, 19. The evaporation substance, i.e. the $GaBr_2$ or $GaBr_3$, is located in the lower space 18, and the additional substance, i.e. the metallic gallium, is located in the upper region. The dividing wall is permeable to the substrate vapor of the evaporation substance, so that it can react with the upper substance. To this end, the dividing wall 17 is constructed as a wire grating or as a perforated shelf, and it has a series of openings, the diameter of which preferably is between 0.5 and 5 mm. If metallic gallium is placed in the upper space 19, then its high surface tension prevents dripping through the holes of the dividing wall 17 into the lower region 18. The dividing wall 17 should of a not react with any of the substances located in the evaporation chamber or be wetted by them. If the aforementioned gallium substances are used, then aluminum oxide or graphite are suitable for this wall 17. Otherwise, the chamber construction corresponds to that according to FIG. 2.

Figure 4:
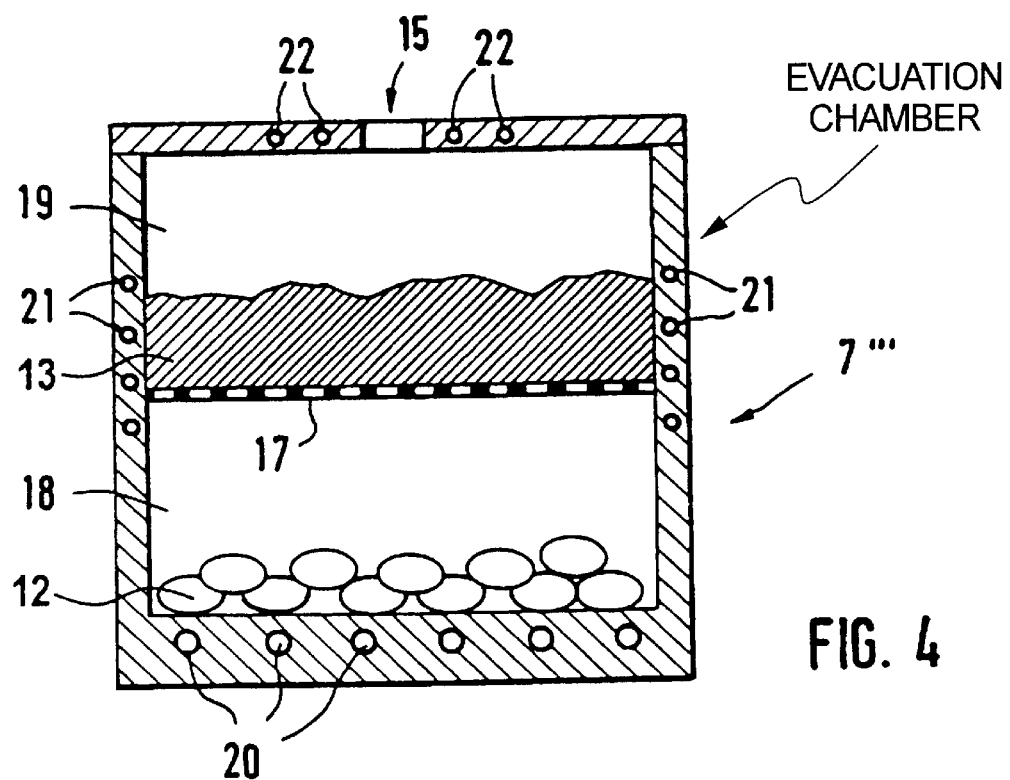
FIG. 4 is a side sectional view of a third embodiment of an evaporation chamber in accordance with the invention.

FIG. 4 depicts a third embodiment of an inventive evaporation chamber 7". This embodiment also has the multi-chamber construction shown in FIG. 3. In this embodiment, a cooling arrangement 20 is provided in the region below the lower space 18, by means of which it is possible to cool this region, that is, to lower its temperature, relative to the remaining region of the chamber.

A heater 21 is provided in the region of the dividing wall 17, which allows heating of the region of the metallic gallium to a higher temperature, for instance to about 500° C. In this way, it is also possible to generate a temperature gradient, for instance from 350° C. to 450° C., between then region of the liquid gallium and the evaporation substance. This results in the evaporation substance remaining in the solid state and not evaporating rapidly. It is understood that the "cooling arrangement" 20 can of course also be a type of heater, by means of which it is possible to heat the regions located proximate thereto to a lower temperature than the temperature in the region of the dividing wall 17.

As further shown in FIG. 4, an additional cooling arrangement 22 is provided in the region of the vapor exit opening 15, by means of which it is possible to cool this region. This also can be a heater that results in a lower heating in relative terms. In this way, it is also possible to locally lower the vapor pressure prevailing in this region, so that the expansion of the dopant vapor stream emerging through the exit opening into the vacuum is low, preventing divergence of the vapor jet caused by expansion. Lastly, it should be noted that all heating and cooling arrangements can be controlled by the control unit 9 shown in FIG. 1.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a continuous vapor stream containing a compound having gallium therein in monovalent form in a vacuum coating procedure for vacuum coating a substrate, comprising the steps of:
   providing an evacuation chamber which is closed on all sides and which has a vapor stream exit opening;
   disposing a multivalent gallium-containing evaporation substance, selected from the group consisting of evaporation substances containing gallium in bivalent form and evaporation substances containing gallium in trivalent form, in said evaporation chamber;
   disposing metallic gallium in said evaporation chamber;
   evaporating said evaporation substance in said evaporation chamber and thereby generating a vapor which comes into contact with said metallic gallium, for reducing said multivalent gallium to monovalent gallium and causing a continuous vapor stream, containing said monovalent gallium, to exit from said evacuation chamber via said vapor exit opening.

2. A method as claimed in claim 1 comprising providing a first level disposed below a second level in said evacuation chamber, and disposing said evaporation substance at said first level in said evacuation chamber and disposing said metallic gallium at said second level in said evacuation chamber, and thereby evaporating said evaporation substance separately from said metallic gallium.

3. A method as claimed in claim 2 comprising producing a temperature gradient from 300° C. to 500° C. in said evacuation chamber between said metallic gallium and said evaporation substance.

4. A method as claimed in claim 3 comprising producing said temperature gradient from 350° C. to 450° C.

5. A method as claimed in claim 3 comprising producing said temperature gradient by cooling said evaporation substance.

6. A method as claimed in claim 3 comprising producing said temperature gradient by heating said metallic gallium.

7. A method as claimed in claim 1 comprising mixing said evaporation substance with said metallic gallium in said evacuation chamber and evaporating said evaporation substance mixed in said metallic gallium.

8. A method as claimed in claim 1 comprising generating a temperature in said evacuation chamber in a range between 250° C. and 950° C. for reducing said multivalent gallium to said monovalent gallium.

9. A method as claimed in claim 1 comprising generating a temperature in said evacuation chamber in a range between 300° C. and 900° C. for reducing said multivalent gallium to said monovalent gallium.

10. A method as claimed in claim 1 comprising cooling said evaporation chamber in a region surrounding said vapor exit opening.

11. A method as claimed in claim 1 comprising providing a vapor exit opening in said evacuation chamber having a diameter in a range between 2 μm and 2 mm.

12. A method as claimed in claim 1 comprising providing a vapor exit opening in said evacuation chamber having a diameter in a range between 5 μm and 1.5 mm.

13. A method as claimed in claim 1 comprising providing a vapor exit opening in said evacuation chamber having a diameter in a range between 10 μm and 1 mm.

14. A method as claimed in claim 1 comprising forming said evaporation chamber of a material which does not react with, and which is not wetted by, said evaporation substance.

15. A method as claimed in claim 1 comprising forming said evaporation chamber of a material which does not react with, and which is not wetted by, said metallic gallium.

16. A method as claimed in claim 1 comprising forming said evaporation chamber of a material which does not react with, and which is not wetted by, said evaporation substance nor with said metallic gallium.

17. A method as claimed in claim 1 comprising forming said evaporation chamber of a material selected from the group consisting of graphite, aluminum oxide and boric nitride.

18. A method as claimed in claim 1 comprising selecting said evaporation substance from the group consisting of gallium bromide compounds and gallium iodide compounds.

19. A method as claimed in claim 1 comprising evaporating a coating material for said substrate in said evacuation chamber at a time selected from the group of times consisting of before evaporation of said evaporation compound, during evaporation of said evaporation compound, and after evaporation of said evaporation compound.

20. A method as claimed in claim 19 comprising employing x-ray absorber material as said coating material.

* * * * *